United States Patent
Teramoto et al.

(10) Patent No.: US 7,739,631 B2
(45) Date of Patent: Jun. 15, 2010

(54) TESTING METHOD AND METHOD FOR MANUFACTURING AN ELECTRONIC DEVICE

(75) Inventors: Ryuuichi Teramoto, Yokohama (JP); Seiji Onoue, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 185 days.

(21) Appl. No.: 11/856,323

(22) Filed: Sep. 17, 2007

(65) Prior Publication Data

US 2008/0178131 A1 Jul. 24, 2008

(30) Foreign Application Priority Data

Sep. 25, 2006 (JP) ............................ 2006-259460
Sep. 3, 2007 (JP) ............................ 2007-227991

(51) Int. Cl.
*G06F 17/50* (2006.01)
*G06F 19/00* (2006.01)
*G01R 31/00* (2006.01)
*G06F 11/00* (2006.01)
*G01R 31/28* (2006.01)

(52) U.S. Cl. ............................ 716/4; 700/110; 702/59; 702/84; 702/181; 714/25; 714/37; 714/726; 324/537

(58) Field of Classification Search .................. 716/4; 700/110; 702/59, 84, 181; 714/25, 37, 726; 324/537
See application file for complete search history.

(56) References Cited

U.S. PATENT DOCUMENTS

| | | | | |
|---|---|---|---|---|
| 5,528,516 | A * | 6/1996 | Yemini et al. ............... | 702/181 |
| 5,661,668 | A * | 8/1997 | Yemini et al. ............... | 702/186 |
| 6,249,755 | B1 * | 6/2001 | Yemini et al. ............... | 702/183 |
| 6,738,933 | B2 * | 5/2004 | Fraenkel et al. ............. | 714/47 |
| 6,751,519 | B1 * | 6/2004 | Satya et al. ................. | 700/121 |
| 6,813,572 | B2 * | 11/2004 | Satya et al. ................. | 702/82 |
| 6,841,403 | B2 * | 1/2005 | Tanaka et al. ............... | 438/14 |
| 6,868,367 | B2 * | 3/2005 | Yemini et al. ............... | 702/183 |
| 6,885,950 | B2 * | 4/2005 | Mitsutake et al. ........... | 702/58 |
| 7,003,433 | B2 * | 2/2006 | Yemini et al. ............... | 702/183 |

(Continued)

FOREIGN PATENT DOCUMENTS

JP 2000195766 7/2000

(Continued)

OTHER PUBLICATIONS

Parks et al., "The Nature of Defect Size Distributions in Semiconductor Processes", IEEE/SEMI International Semiconductor Manufacturing Science Symposium, May 22-24, 1989, pp. 131-135.*

(Continued)

*Primary Examiner*—Phallaka Kik
(74) *Attorney, Agent, or Firm*—Pearne & Gordon LLP (57) ABSTRACT

A testing method includes: storing QC data for each of electronic device manufacturing processes in a storage unit; changing the QC data for each of the processes to a common fixed form of data; providing a contour for the QC data for each of the processes using the common fixed form of data; comparing a singularity map to a failure generation map for a completed device; and finding a causal process for a failure and a defect through the comparison.

16 Claims, 12 Drawing Sheets

U.S. PATENT DOCUMENTS

| | | | | |
|---|---|---|---|---|
| 7,065,725 | B2* | 6/2006 | Yajima et al. | 716/4 |
| 7,107,185 | B1* | 9/2006 | Yemini et al. | 702/183 |
| 7,185,248 | B2* | 2/2007 | Kondo | 714/724 |
| 7,302,653 | B2* | 11/2007 | Allen et al. | 716/4 |
| 7,310,788 | B2* | 12/2007 | Allen et al. | 716/4 |
| 7,337,090 | B1* | 2/2008 | Yemini et al. | 702/183 |
| 7,383,156 | B2* | 6/2008 | Matsusita et al. | 702/183 |
| 7,478,347 | B2* | 1/2009 | Yajima et al. | 716/4 |
| 7,516,428 | B2* | 4/2009 | Fulga et al. | 716/4 |
| 7,529,634 | B2* | 5/2009 | Mitsutake et al. | 702/58 |
| 2002/0053065 | A1* | 5/2002 | Mitsutake et al. | 716/4 |
| 2003/0097228 | A1* | 5/2003 | Satya et al. | 702/82 |
| 2003/0171836 | A1* | 9/2003 | Yajima et al. | 700/108 |
| 2004/0044485 | A1* | 3/2004 | Kondo | 702/57 |
| 2004/0133294 | A1* | 7/2004 | Chen et al. | 700/110 |
| 2005/0097481 | A1* | 5/2005 | Mitsutake et al. | 716/2 |
| 2006/0190222 | A1* | 8/2006 | Allen et al. | 703/2 |
| 2006/0190223 | A1* | 8/2006 | Allen et al. | 703/2 |
| 2007/0266350 | A1* | 11/2007 | Fulga et al. | 716/4 |

FOREIGN PATENT DOCUMENTS

JP     2005-236094 A     9/2005

OTHER PUBLICATIONS

Shuji, English Translation of Japanese Patent Document No. JP-2005-236094-A, published Sep. 2, 2005, translated by Japan Patent Office automated English translator, translated Aug. 31, 2009, 13 pages.*

Korean Office action for 10-2007-0096481 dated Feb. 27, 2009.

* cited by examiner

PROCESS A

PROCESS B

PROCESS C

PROCESS X

TESTING METHOD AND METHOD FOR MANUFACTURING AN ELECTRONIC DEVICE

CROSS-REFERENCE TO RELATED APPLICATION AND INCORPORATION BY REFERENCE

This application claims benefit of priority based on Japanese Patent Applications filed previously by the applicant, namely, Japanese Patent Application Nos. 2006-259460 (filing date: Sep. 25, 2006) and Japanese Patent Application Nos. 2007-227991 (filing date: Sep. 3, 2007), the contents of which are herein incorporated by reference.

BACKGROUND OF THE INVENTION

1. Field of the Invention

The present invention relates to a testing method and a method of manufacturing an electronic device. The present invention also relates to a testing system and a testing program.

2. Description of the Related Art

A conventional testing method of testing for causes of defects of electronic devices used for semiconductor device manufacturing, for example, is generally destructive. In this method, a wafer is cut at a defect point and observation of the resulting cross-section is conducted using a scanning electron microscope (SEM) or a transmission electron microscope (TEM). According to this method, preparation of a sample in which a cross-section at a defect is to be observed takes time. After the preparation, estimation of a causal process for a defect is conducted through observation of the cross-section, and such estimation is then verified by experiment. Since it takes time and is costly to determine and prevent a defect of an electronic device, simplification for the task of finding the cause of a defect of an electronic device has been in demand. A simulation method has been proposed as a means of solving such problems (see Japanese Patent Application Laid-open No. 2000-195766). However, the problems described above have not yet been solved.

Those problems occur in manufacturing of electronic devices such as liquid crystal displays as well as manufacturing of semiconductors.

SUMMARY OF THE INVENTION

According to a first aspect of the present invention, a testing method includes: storing QC data for each of electronic device manufacturing processes in a storage unit; changing the QC data for each of the processes to a common fixed form of data; providing a contour for the QC data for each of the processes using the common fixed form of data; comparing a singularity map to a failure generation map for a completed device; and finding a causal process for a failure and a defect through the comparison.

According to a second aspect of the present invention, a method of manufacturing an electronic device includes: proceeding each processes for manufacturing an electronic device; storing QC data for each of electronic device manufacturing processes; changing the QC data for each of the processes to a common fixed form of data; providing a contour of the QC data for each of the processes using the common fixed form of data; superimposing a plurality of contours, each provided in the previous step, into a new contour, finding a singularity in the new contour and generating a singularity map; comparing the singularity map to a failure generation map for a completed device; and finding a causal process for a failure and a defect through the comparison.

According to a third aspect of the present invention, a-testing system includes: a data storing device for storing QC data for each of electronic device manufacturing processes in a storage unit; a data-changing-storage unit changing the QC data for each of the processes to a common fixed form of data; distribution-map providing unit which provides a distribution map for the QC data for each of the processes by using a common fixed form of data; a singularity-map-making unit for finding a singularity in the distribution map and making a singularity map; a calculation unit for comparing the singularity map to a failure generation map for a completed device; and finding a causal process for a failure and a defect through the comparison; and a display unit displaying the GC distribution-map, the singularity-map, and the causal process.

According to a fourth aspect of the present invention, a computer program product configured to run an electronic device testing system includes: instructions configured to store QC data for each of electronic device manufacturing processes in a storage unit; instructions configured to provide a distribution map for the QC data for each of the processes; instructions configured to find a singularity in the distribution map and to make a singularity map; instructions configured to compare the singularity map to a failure generation map for a completed device; and instructions configured to find a causal process for a failure and a defect through the comparison.

BRIEF DESCRIPTION OF THE DRAWINGS

FIG. 10(a) shows a cross-section of an electronic device according to design in the process A while FIG. 10(b) shows a cross-section of a model of an electronic device in the process A;

FIG. 11(a) shows a cross-section of an electronic device according to design in the process B while FIG. 11(b) shows a cross-section of a model of an electronic device in the process B; and FIG. 12(a) shows a cross-section of an electronic device according to design in the process C while FIG. 12(b) shows a cross-section of a model of an electronic device in the process C.

DETAILED DESCRIPTION OF THE INVENTION

The present invention is explained forthwith according to the following embodiments; however, it is not limited thereto. Note that parts having the same or similar functions in the drawings are assigned the same or similar reference numerals, and descriptions thereof are omitted.

The present invention is described according to embodiments thereof. However, it is not limited to the following embodiments. Note that descriptions of the same function and parts having the same function are omitted and that the same or similar reference numerals are attached thereto.

First Embodiment

Figure 2:
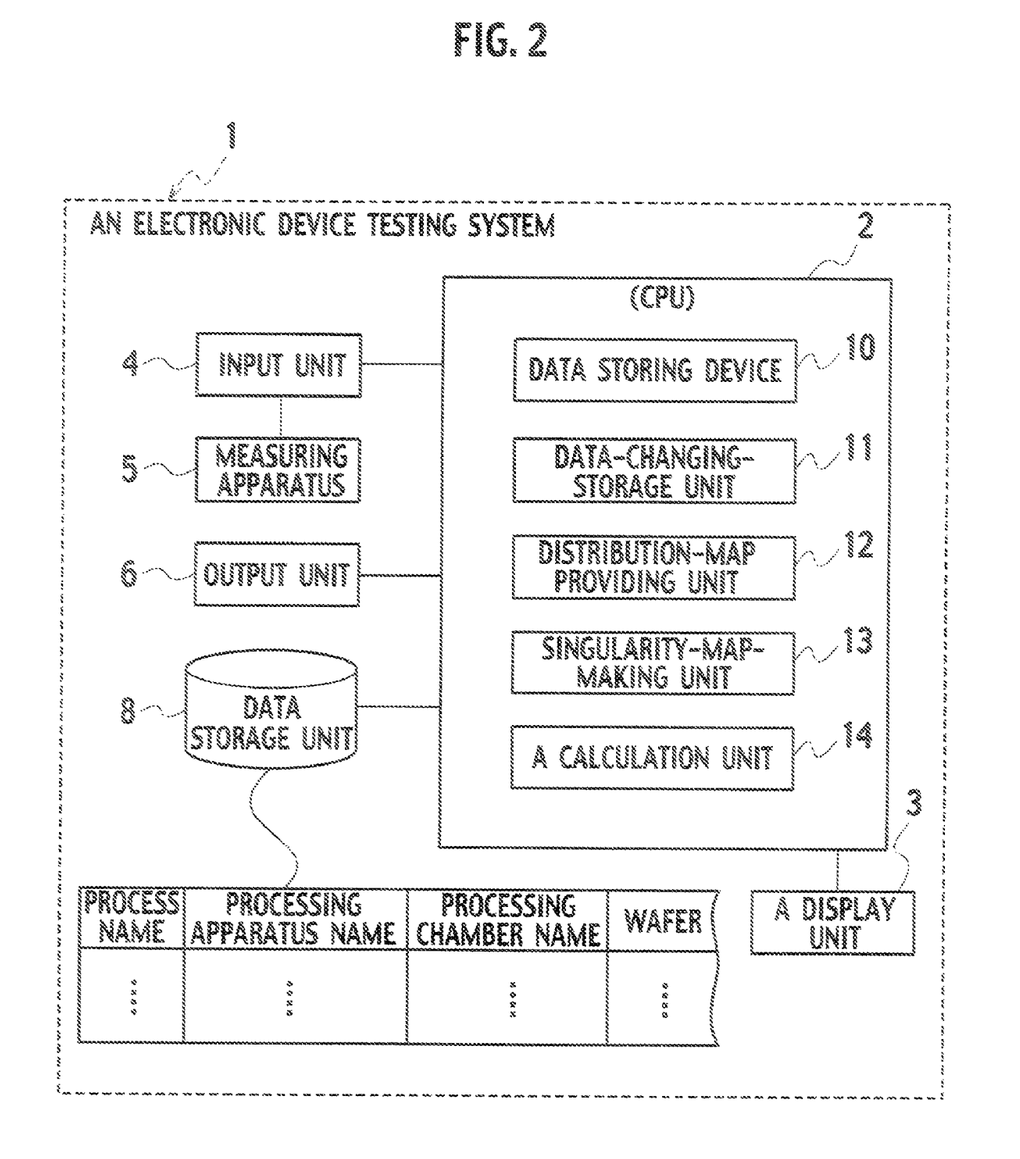
FIG. 2 shows a diagram of a testing apparatus according to the embodiment.

A testing system 1, based on a testing method of the first embodiment shown in FIG. 2, includes a Central processing unit (CPU) 2, a display device 3, an input unit 4, an output unit 6, and a data storage unit 8. A measuring apparatus 5 is connected to input unit 4. The display device 3, the input unit 4, the output unit 6, and the data storage unit 8 are connected to CPU 2. A measuring apparatus 5 is connected to input unit 4. The QC data measured by measuring apparatus 5 is transmitted to CPU 2.

The calculation unit may be configured by an arithmetic logic unit or other related units used in a conventional computer system such as a CPU 2. The CPU 2 as shown in FIG. 2 includes data storing device 10, data-changing-storage unit 11, distribution-map providing unit 12, singularity-map-making unit 13, and a calculation unit 14.

The display device 3 denotes a screen such as a monitor and may be a CRT, an LCD, an LED panel, an electroluminescence (EL) panel, etc.

The input unit 4 denotes a pointing device such as a keyboard or a mouse. Alternatively, it may be configured by a voice device, a reading device for a 'storage medium' such as a CD-ROM or a magnetic tape, a computer network connecting device, and/or an internet connecting device. In response to an inputting operation from the input unit 4, corresponding information (data) is transferred to the CPU 2.

The output unit 6 may be configured by an inkjet printer, a computer network connecting device, and/or an internet connecting device.

The data storage unit 8 may use a memory device such as ROM, RAM, or a magnetic disk and stores a variety of data relating to conditions for electronic device manufacturing as memory data. The database includes process name, processing apparatus name, processing chamber name, wafer information, lot information, process time, process surface pattern trend, process conditions, etc., as shown in FIG. 2. The process conditions include deposition condition, polishing condition, etching condition, and oxidation condition of wafer surfaces, for example. The storage unit stores causes of defects, corresponding improvement measures, and corresponding process names.

The memory data in the data storage unit can be updated any time. In other words, when a different type of electronic device is fabricated or when a new manufacturing condition is used, an experiment for the different type of electronic device under the new manufacturing condition may be conducted, creating and updating the memory data in the data storage unit. Update of the memory data may be conducted from a remote site via an internet communication device, for example. (A Testing Method for Semiconductor Manufacturing)

A testing method for, for example, semiconductor manufacturing according to the first embodiment, using the testing apparatus in FIG. 2, is explained with reference to the flowchart of FIG. 1.

Figure 3:
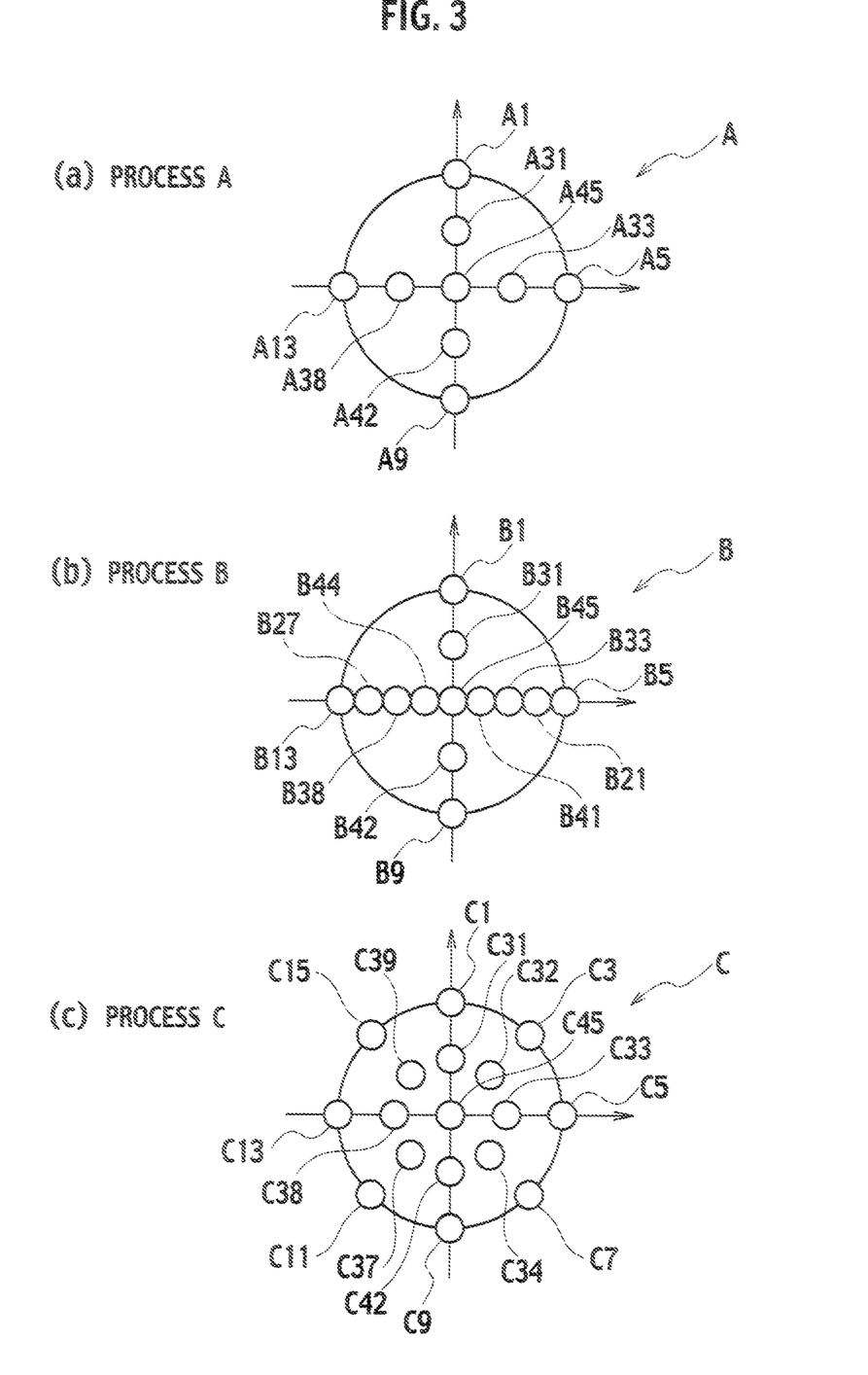
FIG. 3 shows data points to be measured in respective processes A, B, and C.
Figure 4:
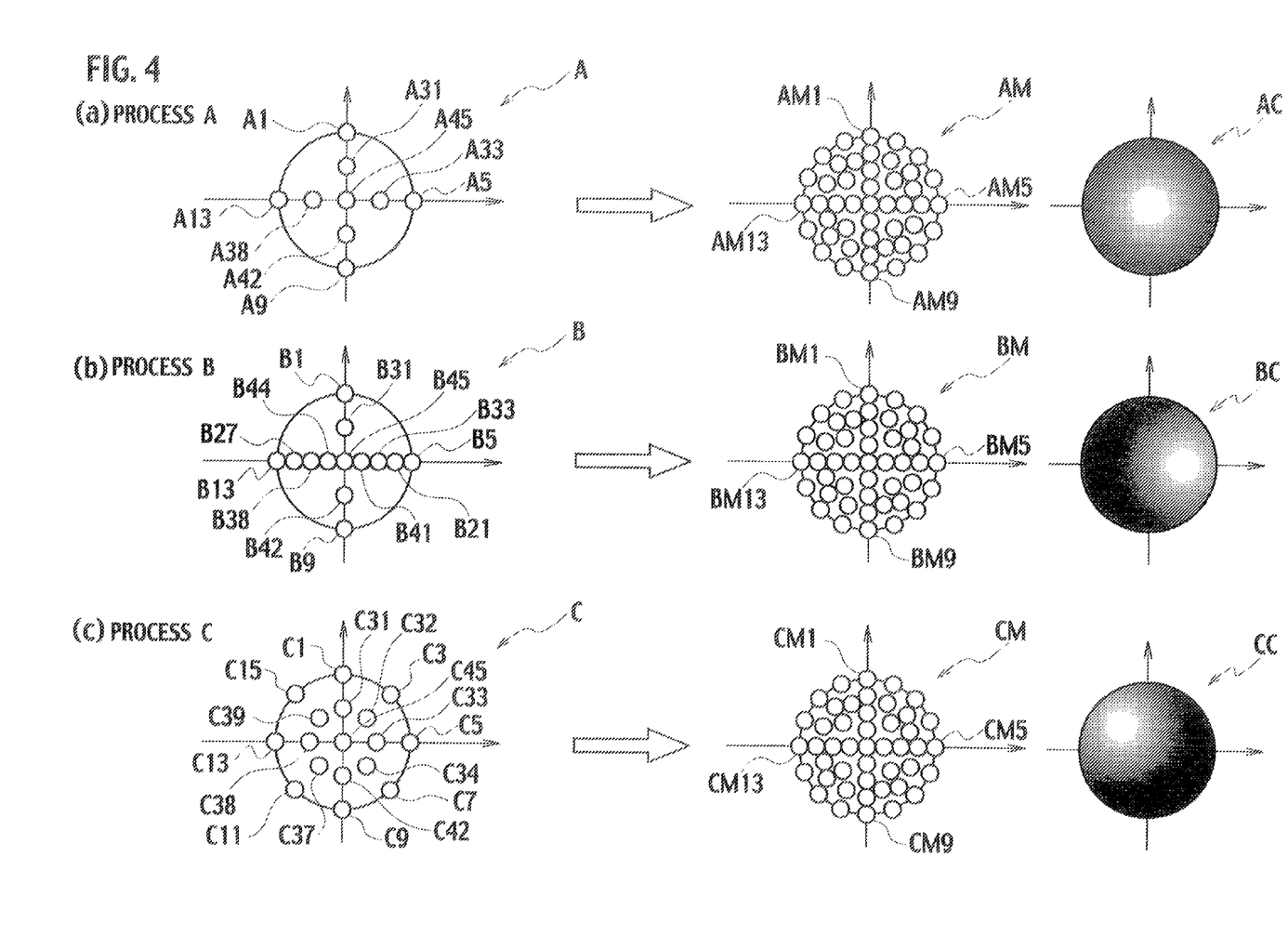
FIG. 4 is a conceptual diagram of interpolation for QC data.

(i) In step S101, an electronic device (semiconductor device) is fabricated through a sequence of processes, and QC (Quality Control) data for every process is provided by measurement data of the device. Assuming that a process A forms an etching mask on a layered structure made from a polycrystalline silicon film, a silicon oxide film, and a silicon nitride film stacked on a silicon substrate (wafer) in this order through photolithography; a process B etches the upper most silicon nitride film using the formed etching mask made of a photoresist, thereby forming an additional etching mask made of the silicon oxide film; and a process C sequentially etches the silicon oxide film and the polycrystalline silicon film using the formed etching mask made of the silicon oxide film, for example; the width of each line in the etching mask made of the photoresist is measured in the process A, the depth of the etched silicon nitride film is measured in the process B, and a total depth of the etched silicon oxide film plus the etched polycrystalline silicon film is then measured in the process C. It should be note that the processes A, B, and C are only examples illustrated for convenience of description and the semiconductor device manufacturing is conducted in actuality through more than several tens to a hundred processes, or several hundred processes in some cases.) In step S102, the QC data for each process is associated with a process name, processing apparatus name, processing chamber name, wafer performance, lot performance, process time, etc. and then stored in a database of the data storage unit 8. At this time, data points for each process are not always the same, as shown in FIGS. 3A, 3B, and 3C, which illustrate data point groups A, B, and C for respective processes A, B, and C. Therefore, interpolation for QC data points is conducted, providing a fixed form of data as shown in FIG. 4 in step S103 to facilitate evaluation for understanding a surface pattern trend, which is described later. More specifically, such interpolation is conducted so that the number (45) of square regions (chip regions) representing respective data points in each of NG (Not Good) 1, NG2, NG3, NG4, NG5, NG6, NG7, NG8, NG9, and NG10, which are failure generation maps provided by testing the surface of an actual semiconductor wafer shown in FIGS. 7 and 8, corresponds to all of the data. In the process A shown in FIG. 4A, for example, the data point group A consisting of A1, A5, A9, A13, A31, A33, A38, A42, and A45 is subjected to interpolation, providing an interpolated data point group AM consisting of 45 data points A1 to A45 or a fixed form of data points. Next, in step S104, contour lines for the interpolated data point group AM of discrete data are displayed to show a contour based on continuous data. The contour is then used to provide a surface pattern trend map AC, which is then made visible. The surface pattern trend map may be made visible by coloring. As with the process A, the processes B and C are interpolated to provide contours, thereby providing surface pattern trend maps BC and CC in step S104 as shown in FIGS. 4B and 4C. The contours provided in step S104 are stored in the database.

Figure 5:
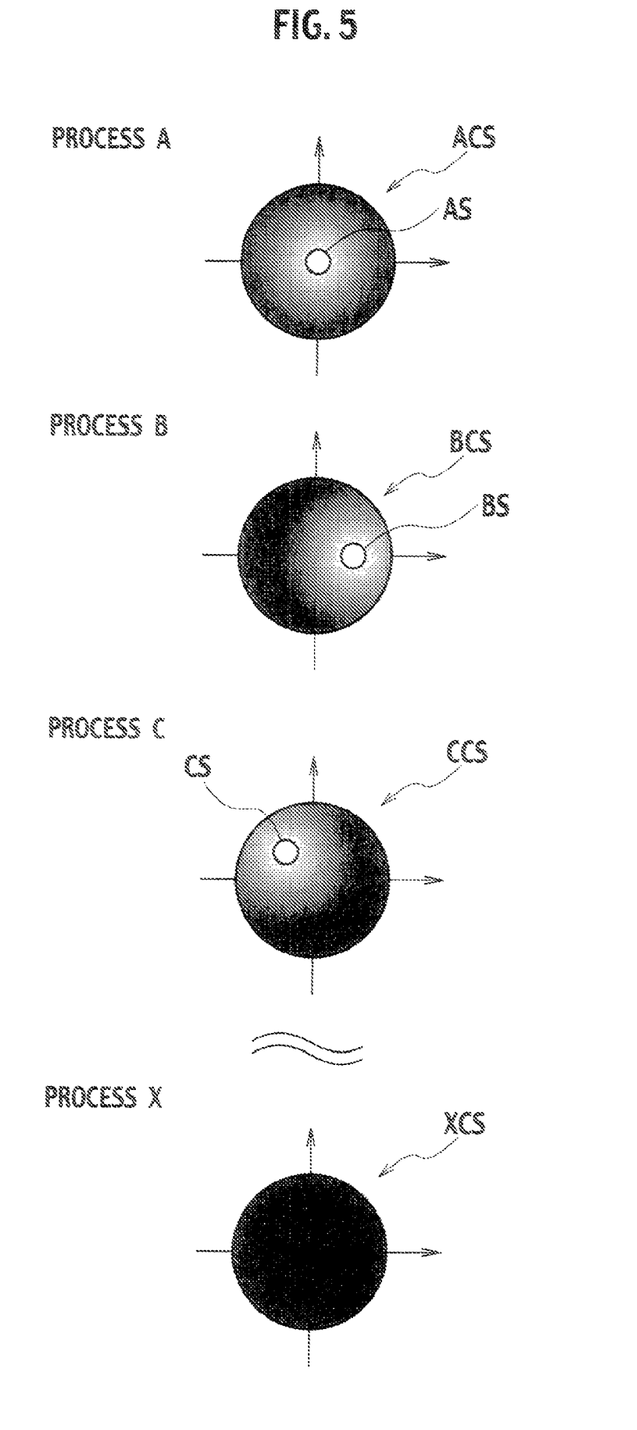
FIG. 5 shows singularity maps.

(ii) In step S105, a singularity is detected from the contour. As is well-known, the 'singularity' in the contour is defined as a point such as the vertex of line segments or an eye-shaped pattern, which does not reside on smooth parts of the contour. 'Singularity' in the QC values that includes a point which is much different in value from the average of the QC values, local maximum, local minimum, and a point having a large differential coefficient or a substantial change in QC values. In step S106, singularities AS, BS, CC, ... are mapped onto the contours of the surface pattern trend maps AC, BC, and CC, producing singularity maps ACS, BCS, CCS, ..., XCS as shown in FIG. 5. The singularity maps ACS, BCS, CCS, ..., XCS are stored in the storage unit. Note that the singularity map XCS is the same as the surface pattern trend map XC when there is no singularity as shown in an illustration for the process X. Accordingly, a singularity map may be described as a surface pattern trend map in this specification.

Figure 6:
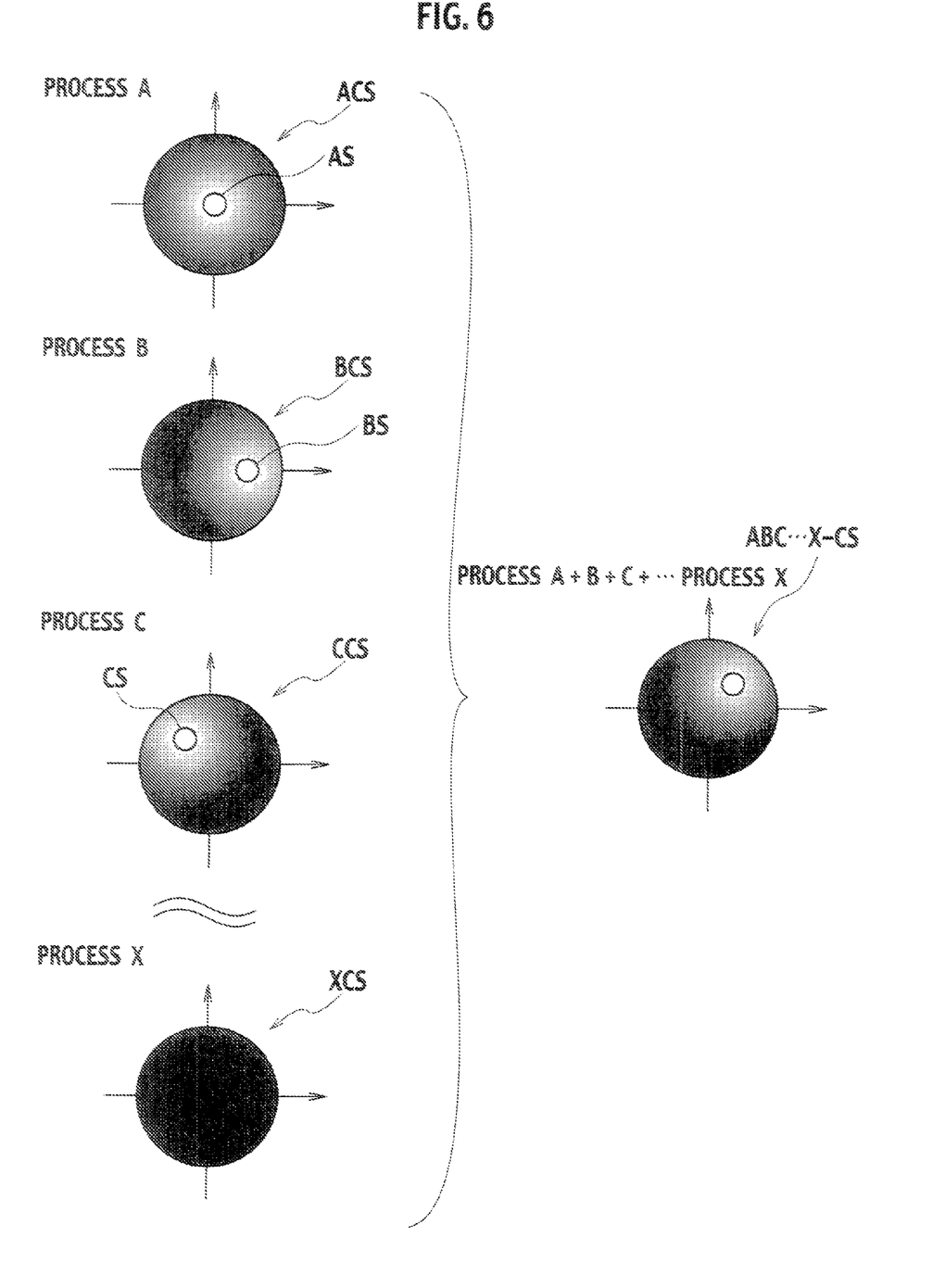
FIG. 6 is a conceptual diagram showing an idea of a method of grasping a surface pattern trend.
Figure 8:
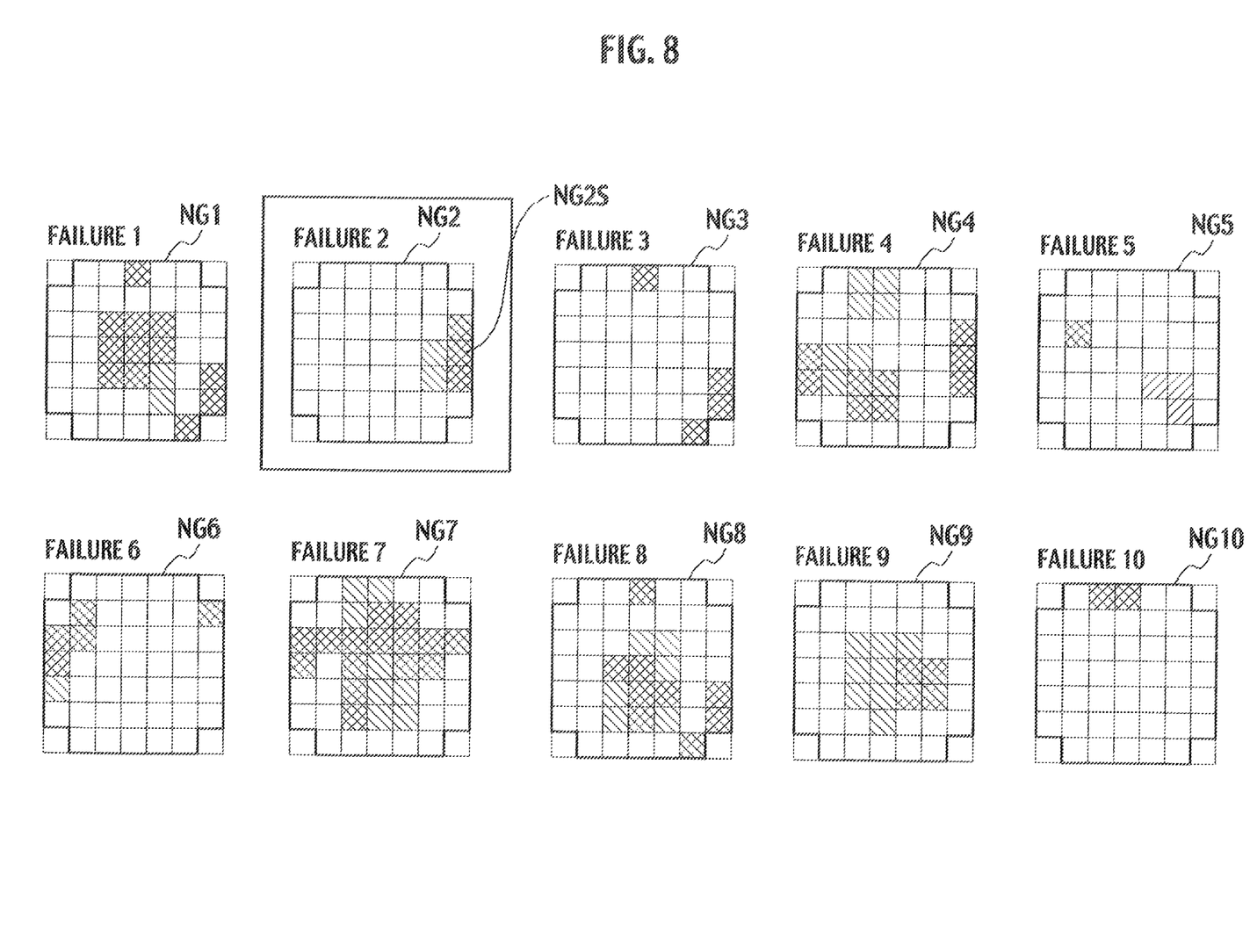
FIG. 8 shows groups of data for electronic device failure generation maps sorted out according to types of failure.

(iii) In step S110, singularity maps ACS, BCS, CCS, ..., and XCS shown in FIG. 5 are retrieved from the storage unit, and the singularity maps ACS, BCS, CCS, ..., XCS for respective processes are compared to the failure generation maps for electronic devices sorted out according to failure pattern as shown in FIG. 8. Herein, 'failure generation map' denotes, for example, chip failure distribution on a wafer determined from measuring electric features with a probe after completion of so-called 'pre-processes' for wafers except for the post-process (assembling process) following a dicing process, in the case of semiconductor device manufacturing. Note that the 'failure generation map' may represent a surface pattern trend of a failure chip provided by measuring the chip with a microscope or the like after a substrate process or so-called 'front-end process' is completed. Alternatively, the 'failure generation map' may be at an arbitrary intermediate location in a surface interconnect process or so-called 'backend process'. Afterwards, a surface pattern trend for each process or a surface pattern trend provided through mutual correlation analysis for several processes is compared to the failure generation maps. As shown in FIG. 6, for example, the singularity maps ACS, BCS, CCS, ..., and XCS for respective processes may be superimposed into singularity maps ABC, ..., XCS, which may be then compared to the failure generation maps. At this time, singularity maps for an arbitrary ones of the consecutive multiple processes may be selected discretely and then superimposed. The surface pattern trend, either for each process or multiple processes, is associated with design data and stored in the storage unit.

Figure 7:
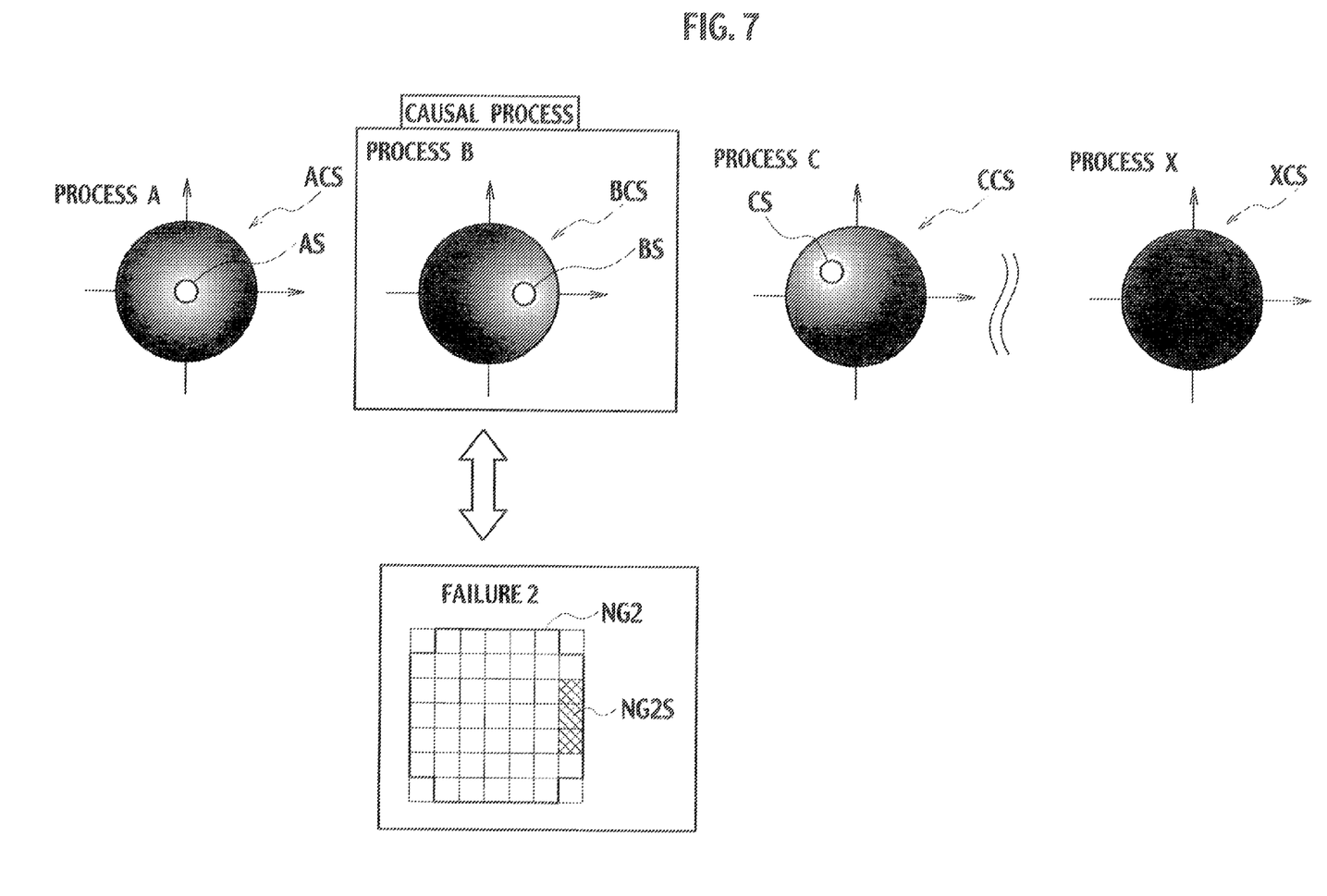
FIG. 7 shows an idea of a method of comparing a singularity map to a failure generation map and thereby determining a failure causing process.

(iv) In step S111, a process that causes a failure and a defect that caused the failure are determined based on a comparison of singularity maps (surface pattern trends) for respective processes to the failure generation maps. In FIGS. 7 and 8, the position of the singularity BS in the singularity map BCS of the contour matches that of the singularity NG2S in the failure generation map NG2 found in each chip of a completed wafer. Therefore, it is estimated that a failure was created in the process B.

(v) In step S112, singularity maps, and failure generation maps, defect causes of failure in causal processes, and improvements in the process are corresponded to each other and stored as defect data in the storage unit. When a defect cause is found through comparison of the singularity maps (surface pattern trends) for respective processes to failure generation maps NG1 to NG10, the detailed corresponding relationship between the singularity map (surface pattern trend) for a causal process and corresponding failure generation map is stored in the database.

According to the first embodiment, wafer surface tendencies and singularities either for each process or multiple processes may be understood and compared to the failure generation maps for a completed devices by studying the tendencies in the distribution of wafer process data such as etching rates or deposition rates for respective processes, which come from the quality control (QC) data for manufacturing processes for electronic devices such as semiconductor devices. To put it another way, through comparison of the singularity for each process shown on the contour to the failure generation maps for completed devices in wafers sorted out according to types of failures, the causal process for a failure of a completed device and the type of failure can be easily found.

A g-destructive testing method for easily examining and finding the cause of a defect of electronic devices is provided. Furthermore, an electronic device manufacturing method using such a testing method is also provided.

First Modified Example of the First Embodiment

Figure 9:
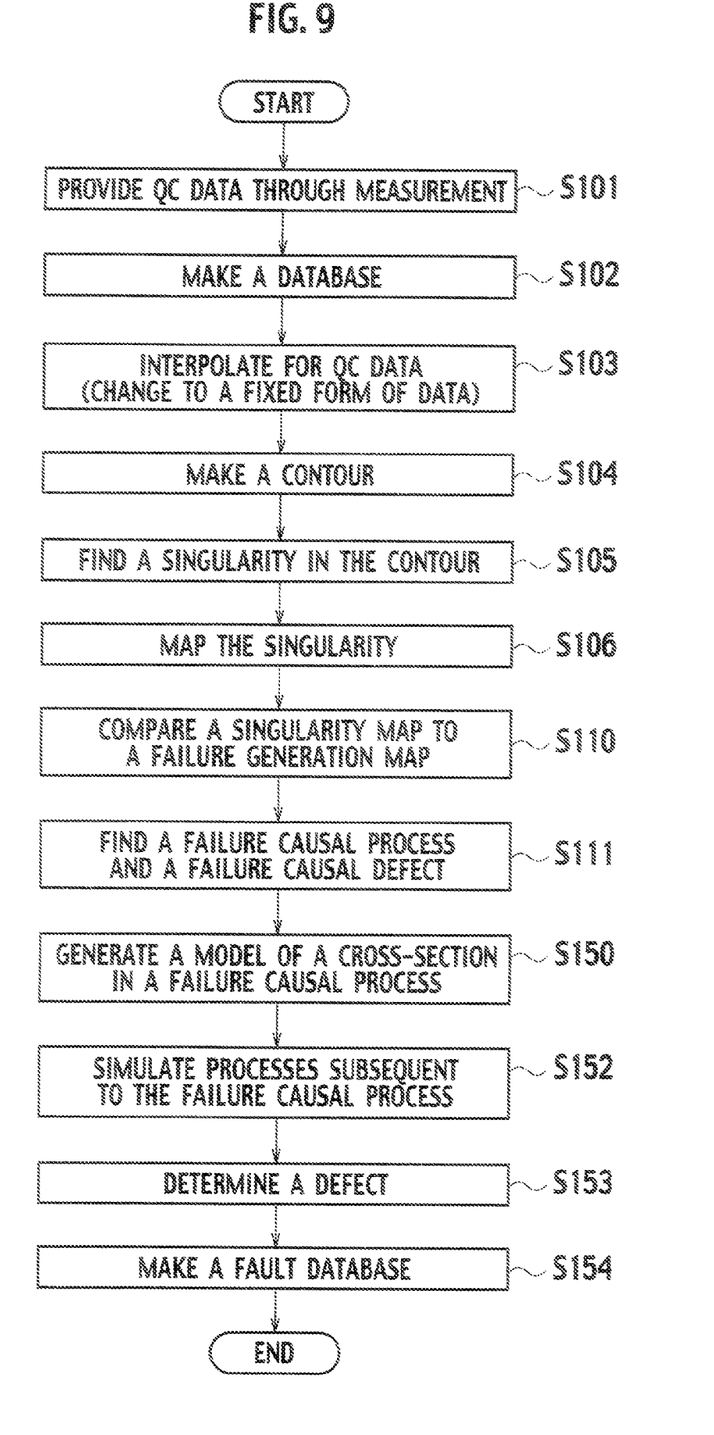
FIG. 9 shows a flowchart for a testing method according to a modified example of the first embodiment.

Referencing to the flowchart of FIG. 9 and cross-sections of an electric device in FIGS. 10A and 10B, 11A and 11B, and 12A and 12B, a testing method according to a modified example of the first embodiment when it is used for a semiconductor device manufacturing method, for example, is described.

Figure 14:
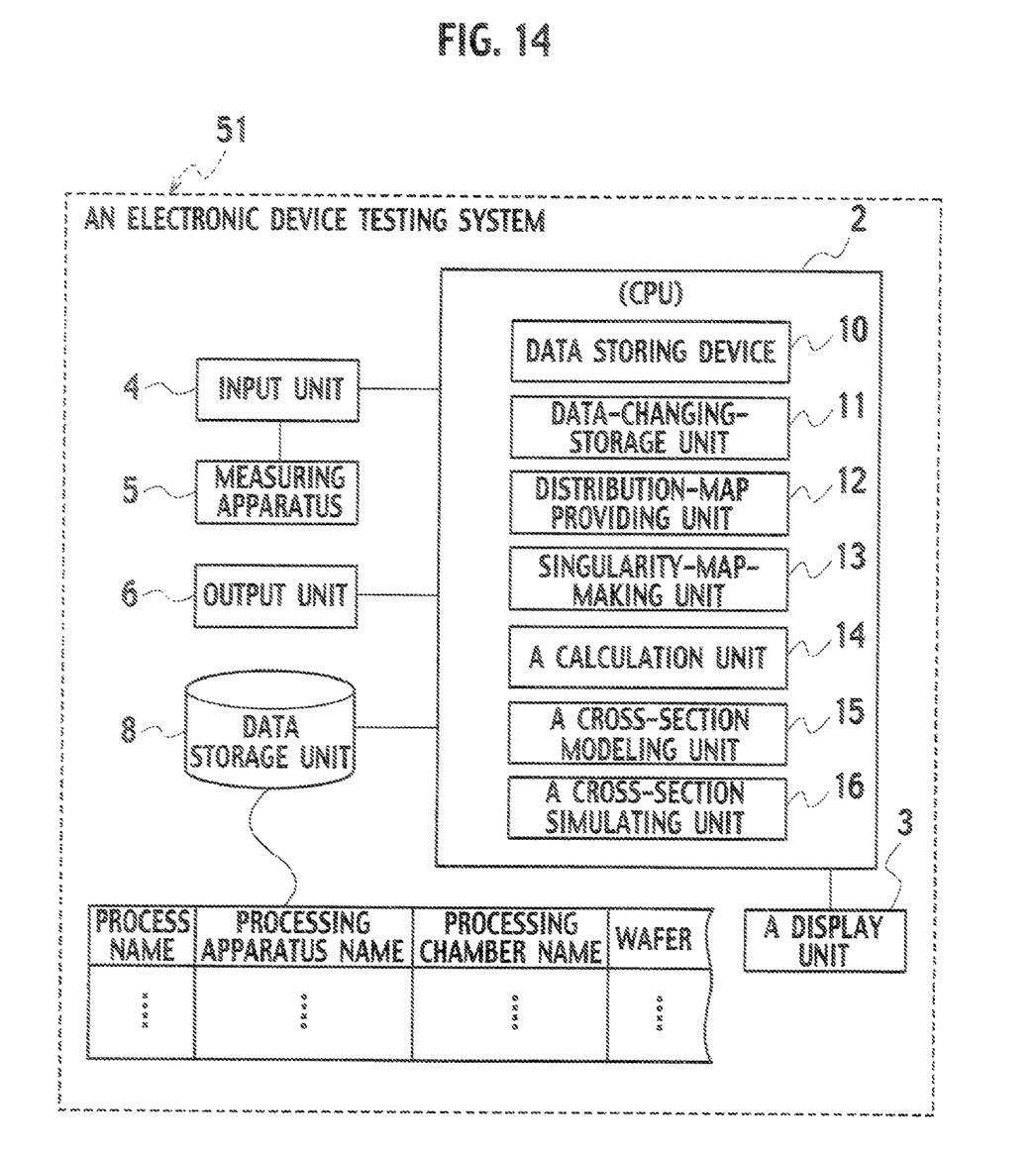
FIG. 14 shows a diagram of a testing apparatus according to the modification of embodiment.

As shown in FIG. 14, a testing system 51 based on a testing method of a modified example one of the first embodiment is configured the same as the testing system shown in FIG. 2, except that the testing system 51 includes a cross-section modeling unit 15, and a cross-section simulating unit 16.

Figure 10:
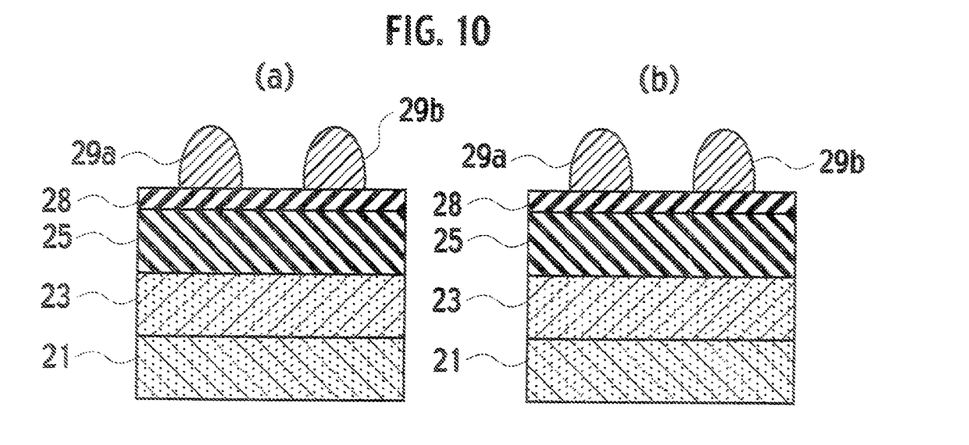

FIG. 10A shows a cross-section of an electronic device according to a design in the process A while FIG. 10B shows a cross-section of a model of the electronic device in the process A. FIGS. 10A and 10B show cross-sections of an electronic device in which etching masks 29a and 29b are formed by photolithography on the layered structure, which is configured by a polycrystalline silicon film 23, a silicon oxide film 25, and a silicon nitride film 28 stacked on a silicon substrate (wafer) 21 in this order.

Figure 11:
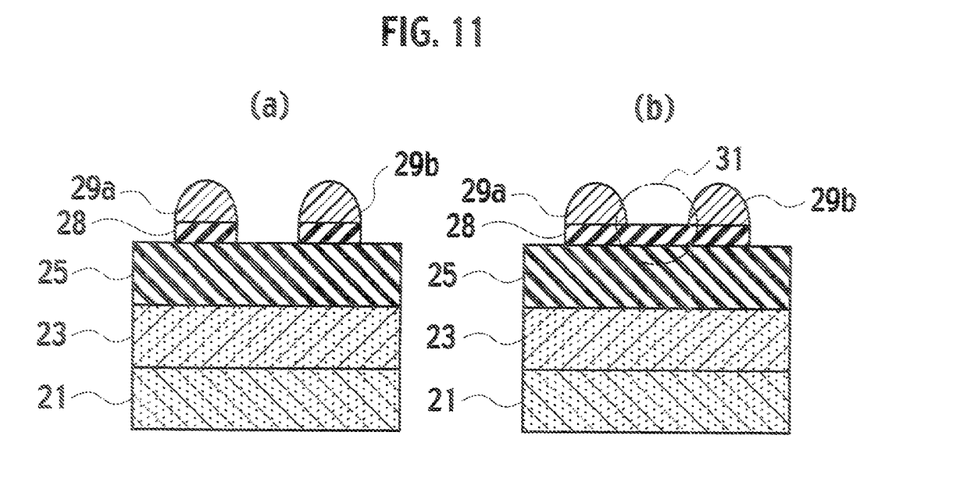

FIG. 11A shows a cross-section of an electronic device according to a design in the causal process B while FIG. 11B shows a cross-section of a model of an electronic device in the process B. FIGS. 11A and 11B show cross-sections of an electronic device provided by etching the uppermost silicon nitride film 28 using the etching masks 29a and 29b, made of photoresist, and thereby forming an additional etching mask of the silicon nitride film 28.

Figure 12:
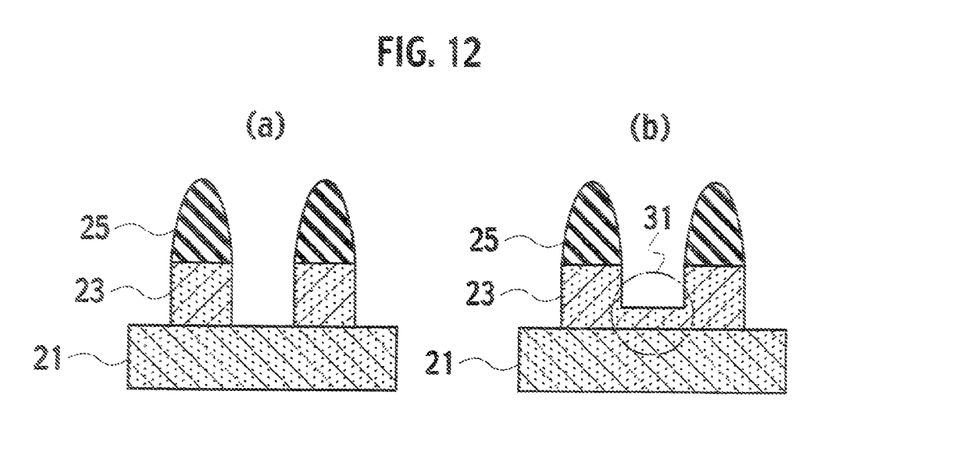

FIG. 12A shows a cross-section of an electronic device according to a design in the process C while FIG. 12B shows a cross-section of a model of an electronic device in the process C. FIGS. 12A and 12B show cross-sections of an electronic device provided by consecutively etching the silicon oxide film 25 and the polycrystalline silicon film 23 using the additional etching mask made of silicon nitride film 28.

Figure 1:
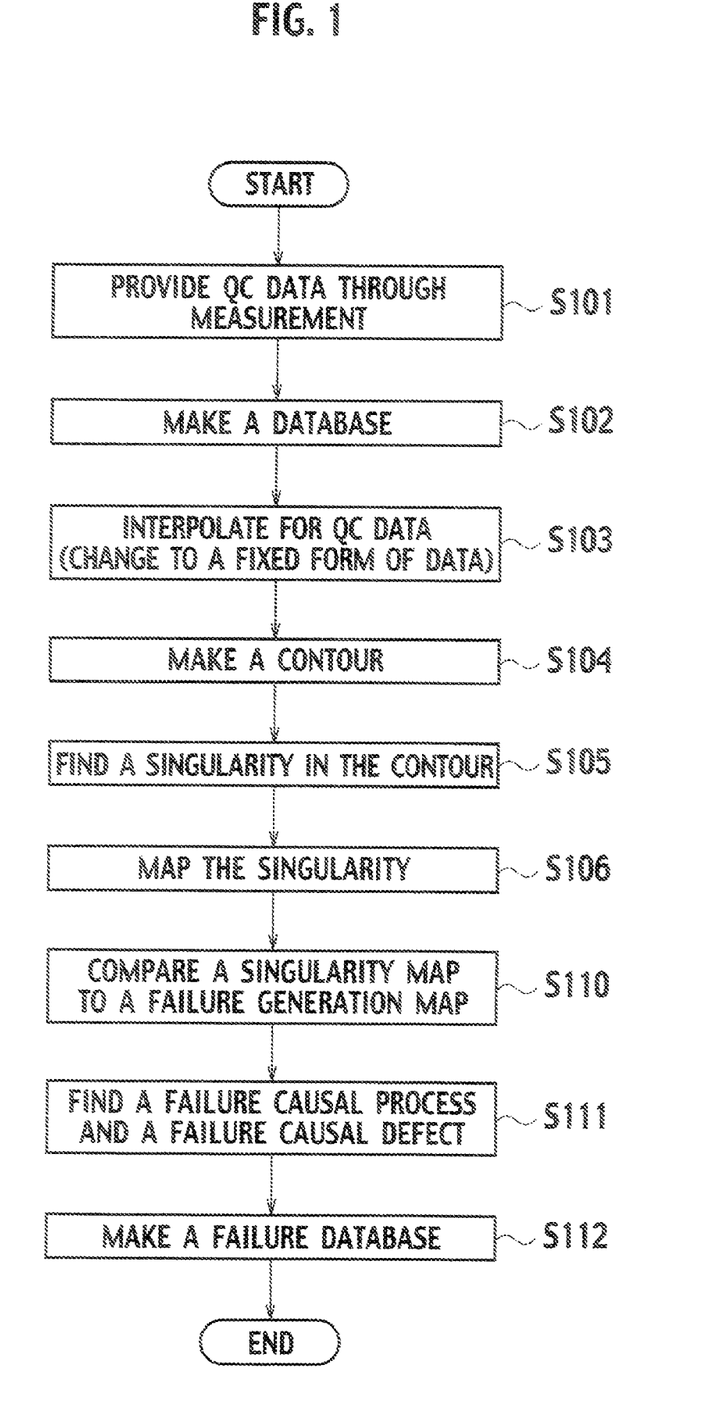
FIG. 1 shows a flowchart for a testing method according to a first embodiment.

The process flow up to step S111 in FIG. 9 is the same as that in the flowchart of FIG. 1. Steps S150 and S151 are mainly described forthwith. After completion of processing in the steps of the flowchart of FIG. 1 corresponding to the descriptions (i) to (iv), a model of a cross-section of the electronic device is made as shown in FIG. 11B in the step S150, based on a defect found in the failure causing process, which was found in the step S111. At this time, it is preferable to also make a model of the cross-section of the electronic device in the process A right before the causal process B, as shown in FIG. 10B, and understand the structure of the cross-sections of the electronic device according to design shown in FIGS. 10A and 11A as well as the model. This makes it easier to estimate a cause of a defect.

In step S152, based on the cross-sectional model presumed in step S150, cross-sections in subsequent processes are estimated by simulation, as shown in FIG. 12B. Afterwards, in step S153, whether the results of the simulation for the cross-sections correspond to measured failures is confirmed, locating a causal process and the cause of a defect. In FIGS. 11B and 12B, for example, a short-circuit defect 33 as shown in FIG. 12B emanating from etching residue 31 shown in FIG.

11B is found. Next, in step S154, the results of the simulation for the cross-sections, the cause for the defect in the causal process, and the improvements for stopping the cause of the defect are compared and stored as defect data in the storage unit.

According to the testing method of the modified example of the first embodiment when it is used for a semiconductor device manufacturing method, modeling a two-dimensional cross-section makes it possible to visually observe phases where a defect occurred to a failure by simulation so that a cause of a failure can be easily determined and that countermeasures for the failure can be easily introduced.

Note that the first embodiment may be combined with the modified example thereof. This combination improves finding of a causal process and a defect cause as well as the results of each of the first embodiment and the modified example thereof.

Second Modified Example of the First Embodiment

According to the first embodiment, a fixed form of data for QC data points is provided in step S103, and a contour is then generated based on the fixed form of data in step S104. However, when QC data points to be measured are common among multiple processes, interpolation for QC data may not be conducted in order to simplify the testing processes, but a contour may be created directly based on common measured QC data points. In the case of FIG. 3, for example, a contour may be generated directly based on QC data points A1, A5, A9, A13, and A45 to be measured in the process A, QC data points B1, B5, B9, B13, and B45 to be measured in the process B, and QC data points C1, C5, C9, C13, and C45 to be measured in the process C. As the number of layers of electronic devices and density thereof increase, the greater the influence of improvement in testing accuracy by understanding a surface pattern trend to improve the yield of the electronic devices. Therefore, it is preferable to provide a fixed form of data for QC data points in step S103 so that a surface pattern trend can be understood more accurately for improving yield of the electronic devices.

Third Modified Example of the First Embodiment

Figure 13:
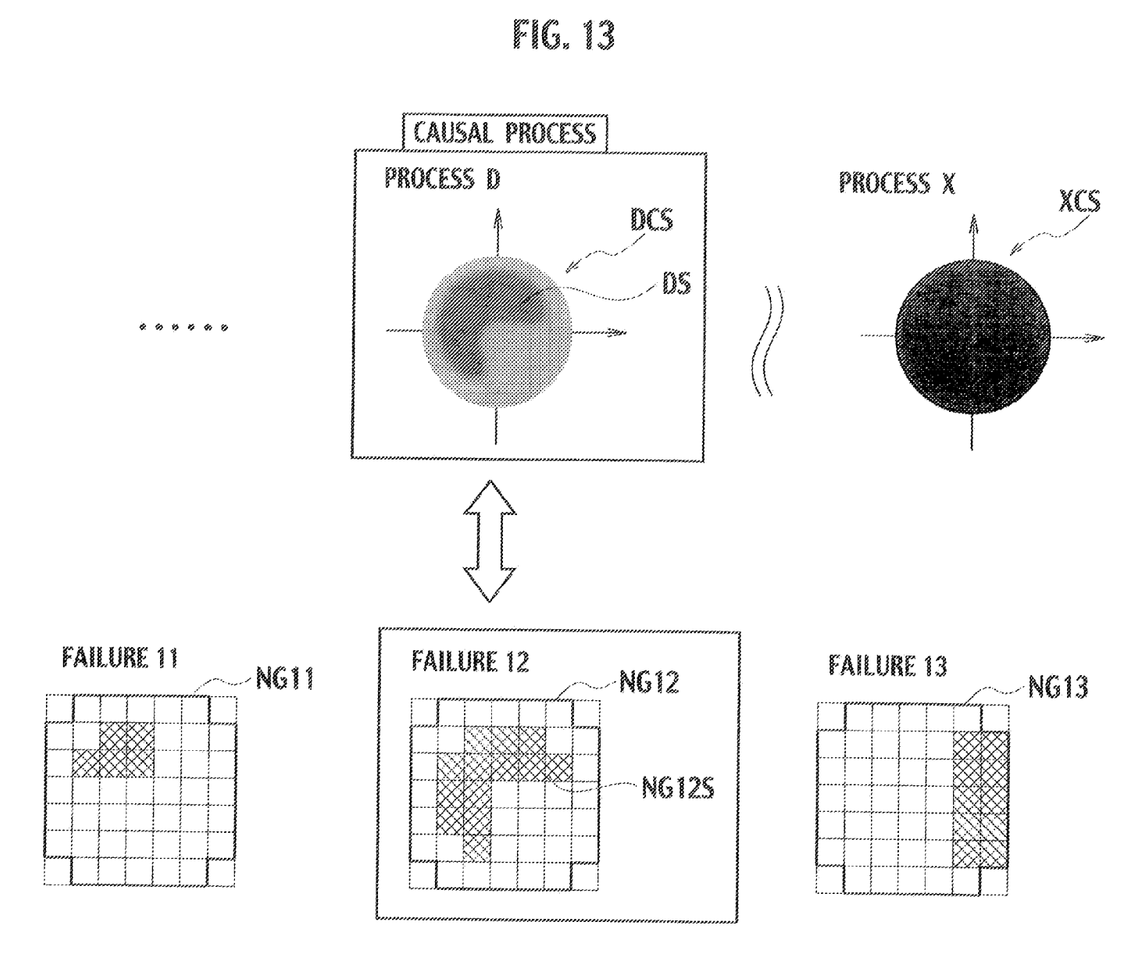
FIG. 13 shows an idea of a method of comparing a singularity map (irregular distribution) to a failure generation map and thereby determining a failure causing process.

According to the first embodiment, a singularity is detected from local maximums and local minimums along the contour in step S105. Afterwards, processing in steps S106, S110, and S111 is performed to identify defects. In this case, a defect in a region DCS (referred to as 'uneven distribution' hereafter) enclosed by an unclear contour line and having distance between contours as shown in FIG. 13 may be found through steps S105, S106, S110, and S111 in the same manner as a singularity is detected. In FIG. 13, for example, singularity maps DCS through XCS (uneven distribution) retrieved from the data storage unit 8 are compared to electronic device failure generation maps NG11, NG12, and NG13 sorted out for each failure pattern. When a match is found at the location of the singularity NG12S in the failure generation map NG12, it is presumed that there was defect caused in the process D.

Second Embodiment

An electronic device testing method according to the second embodiment includes the step S112 of the flowchart of FIGS. 1 and 9 and the steps of accessing the database (including defect data constituted by, for example, singularity maps, failure generation maps, causes of defects in causal processes, and improvements in the process corresponded to each other) stored in the memory section 8 in step S154, finding a process with a tendency to create a defect through comparison of defect improvement (removal of the cause of the defect) data to design data, and carrying out fine adjustment of precision, speed, etc. of manufacturing conditions for above process.

The electronic device testing method according to the second embodiment further includes the adjusting a manufacturing conditions for above process. The adjusting a manufacturing condition for the above process is for example improving the precision and/or the speed of a manufacturing process to adjust the manufacturing condition etc. In addition, many conditions related to the manufacturing process are adjusted. Therefore, after above adjustment, an electronic device having above process (an example: Production of semiconductor device) can be manufactured.

According to the second embodiment, a method for curing the cause of defects may be achieved by referencing a library of past surveyed causes of defects. This improves precision and speed in electronic device manufacturing. As a result, in manufacturing an electronic device, the precision and/or speed etc. can be improved.

(A Computer Program Product Used For A Semiconductor Device Manufacturing Testing Method)

A computer program product used for a semiconductor device manufacturing testing system 1 is provided. The computer program product is configured to run an electronic device testing system including: instructions configured to store QC data for each of electronic device manufacturing processes in a storage unit; instructions configured to provide a distribution map for the QC data for each of the processes; instructions configured to find a singularity in the distribution map and to make a singularity map; instructions configured to compare the singularity map to a failure generation map for a completed device; and instructions configured to find a causal process for a failure and a defect through the comparison.

The testing program for electronic devices may include a extracting singularities from a distribution map made by superimposing multiple distribution maps and then generating a singularity map instead of step (iii) (as described above). Alternatively, the testing program for electronic devices may further include a step (vi) of identifying a causal process and modeling a cross-sectional form of an electronic device fabricated in the identified causal process, simulating a cross-sectional form fabricated in a process following the causal process based on the modeled cross-sectional form, and verifying that identification of the failure causal process and the defect is correct.

The testing program for electronic devices described above may be stored in a computer-readable recording medium. The aforementioned testing program for electronic devices may be implemented by a computer system reading this recording medium and executing the testing program for electronic devices. The 'recording medium' denotes a medium capable of storing programs such as an auxiliary memory unit for a computer, semiconductor memory, a magnetic disc, an optical disc, a magneto optical disc, or a magnetic tape. The 'recording medium' includes a carrier for computer data signals.

Other Embodiments

As described above, while the present invention has been described according to the embodiments, the descriptions and the drawings configuring a part of this disclosure do not limit the scope of the present invention. This disclosure allows those skilled in the arts to know a variety of substitutive embodiments, working examples and operational techniques. While the electronic device testing method is disclosed as an example according to the first and the second embodiment, an electronic device manufacturing method including the said method as a process may be provided. An electronic device testing system relating to the electronic device testing method may also be provided. Therefore, the present invention naturally includes a variety of embodiments not specifically described herein. Accordingly, the scope of the present invention should be determined only based on specific descriptions in the claims reasonable from the aforementioned descriptions.

What is claimed is:

1. A testing method comprising:
    storing QC data for each process of electronic device manufacturing processes in a storage unit;
    providing a distribution map for the QC data for each of the processes;
    finding a singularity in the distribution map and making a singularity map;
    comparing the singularity map to a failure generation map for a completed electronic device;
    determining by a computer a causal process for a failure and a defect through the comparison;
    modeling a cross-section of an electronic device produced by the causal process for the failure, which is found through determining the causal process for the failure;
    simulating, based on the modeled cross-section, a cross-section to be expected after the causal process for the failure is completed; and
    verifying whether the causal process for the failure and the defect are found correctly.

2. The method according to claim 1, wherein the singularity map step includes, superimposing a plurality of distribution maps each provided in the former step into a new distribution map, and finding a singularity in the new distribution map and generating another singularity map.

3. The method according to claim 1, wherein the providing of a distribution map includes:
    changing the QC data for each of the processes to a common fixed form of data; and
    providing the distribution map for the QC data for each of the processes by using the common fixed form of data.

4. The method according to claim 2, wherein the providing of a distribution map includes:
    changing the QC data for each of the processes to a common fixed form of data; and
    providing the distribution map for the QC data for each of the processes by using the common fixed form of data.

5. A method of manufacturing an electronic device comprising:
    proceeding each processes for manufacturing an electronic device;
    storing QC data for each process of electronic device manufacturing processes in a storage unit;
    providing a distribution map for the QC data for each of the processes;
    finding a singularity in the distribution map and making a singularity map;
    comparing the singularity map to a failure generation map for a completed electronic device;
    finding by a computer a causal process for a failure and a defect through the comparison;
    modeling a cross-section of an electronic device provided by the causal process for the failure, which is found through the finding a causal process for the failure;
    simulating, based on the modeled cross-section, a cross-section to be expected after the causal process for the failure is completed; and
    verifying whether the causal process for the failure and the defect are found correctly.

6. The method according to claim 5, further comprising:
    adjusting a manufacturing conditions for the causal process for the failure.

7. The method according to claim 5 wherein the providing the singularity map step includes:
    superimposing a plurality of distribution maps each provided in the former step into a new distribution map;
    finding a singularity in the new distribution map; and
    generating a singularity map.

8. The method according to claim 7, wherein at a providing a distribution map step, changing the QC data for each of the processes to a common fixed form of data, and providing a distribution map for the QC data for each of the processes by using the common fixed form of data.

9. The method according to claim 5, wherein at a providing a distribution map step, changing the QC data for each of the processes to a common fixed form of data, and providing a distribution map for the QC data for each of the processes by using the common fixed form of data.

10. A testing system comprising:
    a data storing device storing QC data for each process of electronic device manufacturing processes in a storage unit;
    a data-changing-storage unit changing the QC data for each of the processes to a common fixed form of data,
    a distribution map providing unit providing a distribution map for the QC data for each of the processes by using the common fixed form of data;
    a singularity-map-making unit for finding a singularity in the distribution map and making a singularity map;
    a calculation unit for comparing the singularity map to a failure generation map for a completed electronic device, and for finding a causal process for a failure and a defect through the comparison;
    a display unit displaying the distribution map, the singularity map, and the causal process;
    a cross-section modeling unit modeling a cross-section of an electronic device provided by the causal process for the failure, which is found through the finding a causal process for the failure;
    simulating unit simulating, based on the modeled cross-section, a cross-section to be expected after the causal process for the failure is completed.

11. The system according to claim 10, wherein the distribution map is a plurality of superimposed distribution maps each provided in said distributing map providing unit into a new distribution map, finds a singularity in the new distribution map and generates a singularity map.

12. The system according to claim 11, further comprising:
    a cross-section modeling unit modeling a cross-section of an electronic device provided by the causal process for the failure, which is found through the finding a causal process for the failure;
    simulating unit simulating, based on the modeled cross-section, a cross-section to be expected after the causal process for the failure is completed.

13. The system according to claim 10, wherein
    the calculation unit verifies whether the causal process for the failure and the defect are found correctly.

14. A computer program product stored on a non-transitory computer data storage device and configured to operate an electronic device testing system comprising:

instructions configured to store QC data for each process of electronic device manufacturing processes in a storage unit;

instructions configured to provide a distribution map for the QC data for each of the processes;

instructions configured to find a singularity in the distribution map and make a singularity map;

instructions configured to compare the singularity map to a failure generation map for a completed electronic device;

instructions configured to find a causal process for a failure and a defect through the comparison;

instructions configured to model a cross-section of an electronic device provided by the causal process for the failure, which is found through the finding a causal process for the failure; and instructions configured to simulate, based on the modeled cross-section, a cross-section to be expected after the causal process for the failure is completed.

15. The computer program product according to claim 14, further including instructions configured to superimpose a plurality of distribution maps, into a new distribution map, find a singularity in the new distribution map and generate a singularity map when the singularity map is made.

16. The computer program product according to claim 14, further including instructions configured to store QC data includes:

changing the QC data for each of the processes to a common fixed form of data; and providing a distribution map for the QC data for each of the processes by using the common fixed form of data.

* * * * *